United States Patent
Nakamura

(10) Patent No.: US 8,223,107 B2
(45) Date of Patent: Jul. 17, 2012

(54) DATA DRIVER AND DISPLAY APPARATUS USING THE SAME INCLUDING CLOCK CONTROL CIRCUIT AND SHIFT REGISTER CIRCUIT

(75) Inventor: Kazuo Nakamura, Shiga (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 809 days.

(21) Appl. No.: 11/987,860

(22) Filed: Dec. 5, 2007

(65) Prior Publication Data

US 2008/0136799 A1 Jun. 12, 2008

(30) Foreign Application Priority Data

Dec. 7, 2006 (JP) .................................. 2006-330962

(51) Int. Cl.
*G09G 3/36* (2006.01)
(52) U.S. Cl. ....................................................... 345/100
(58) Field of Classification Search .................... 345/100
See application file for complete search history.

(56) References Cited

U.S. PATENT DOCUMENTS

| | | | | |
|---|---|---|---|---|
| 5,128,974 | A | * | 7/1992 | Maekawa .......................... 377/79 |
| 5,977,944 | A | * | 11/1999 | Kubota et al. .................. 345/100 |
| 5,990,857 | A | | 11/1999 | Kubota et al. |
| 6,414,670 | B1 | * | 7/2002 | Kim ................................ 345/100 |
| 6,417,829 | B1 | * | 7/2002 | Jung et al. .................... 345/100 |
| 6,437,768 | B1 | * | 8/2002 | Kubota et al. .................. 345/100 |
| 6,859,070 | B2 | | 2/2005 | Kinoshita et al. |
| 7,133,017 | B2 | | 11/2006 | Hayashi et al. |
| 7,289,593 | B2 | | 10/2007 | Tobita et al. |
| 7,505,022 | B2 | | 3/2009 | Matsuda et al. |
| 2003/0210220 | A1 | * | 11/2003 | Hebiguchi ...................... 345/100 |
| 2005/0179636 | A1 | * | 8/2005 | Koyama et al. ............... 345/100 |
| 2005/0206635 | A1 | * | 9/2005 | Hashimoto .................... 345/204 |
| 2006/0221041 | A1 | | 10/2006 | Cho et al. |

FOREIGN PATENT DOCUMENTS

| | | |
|---|---|---|
| JP | 59-14195 | 1/1984 |
| JP | 2004-185787 (A) | 7/2004 |
| JP | 2004-227674(A) | 8/2004 |
| JP | 2005-222655 (A) | 8/2005 |
| JP | 2006-277860 (A) | 10/2006 |

OTHER PUBLICATIONS

Japanese Office Action dated Dec. 6, 2011, with partial English translation.
United States Office Action dated May 17, 2012 in U.S. Appl. No. 13/420,452.

* cited by examiner

*Primary Examiner* — Adam J Snyder
(74) *Attorney, Agent, or Firm* — McGinn Intellectual Property Law Group, PLLC

(57) ABSTRACT

A data driver circuit includes a clock control circuit configured to generate a shift clock signal in synchronization to a clock signal; a shift register circuit having flip-flops in cascade-connection and configured to shift a pulse signal in synchronization with the shift clock signal, and a control circuit configured to receive a display data in response to the shifted pulse signal from the shift register circuit and to drive data lines of a display section based on display data to display the display data on the display section. The flip-flops are grouped in units of N (N is an integer of 2 or more) flip-flops into M (M is an integer of 2 or more) partial shift registers, and the shift register circuit is reset in units of partial shift registers.

19 Claims, 12 Drawing Sheets

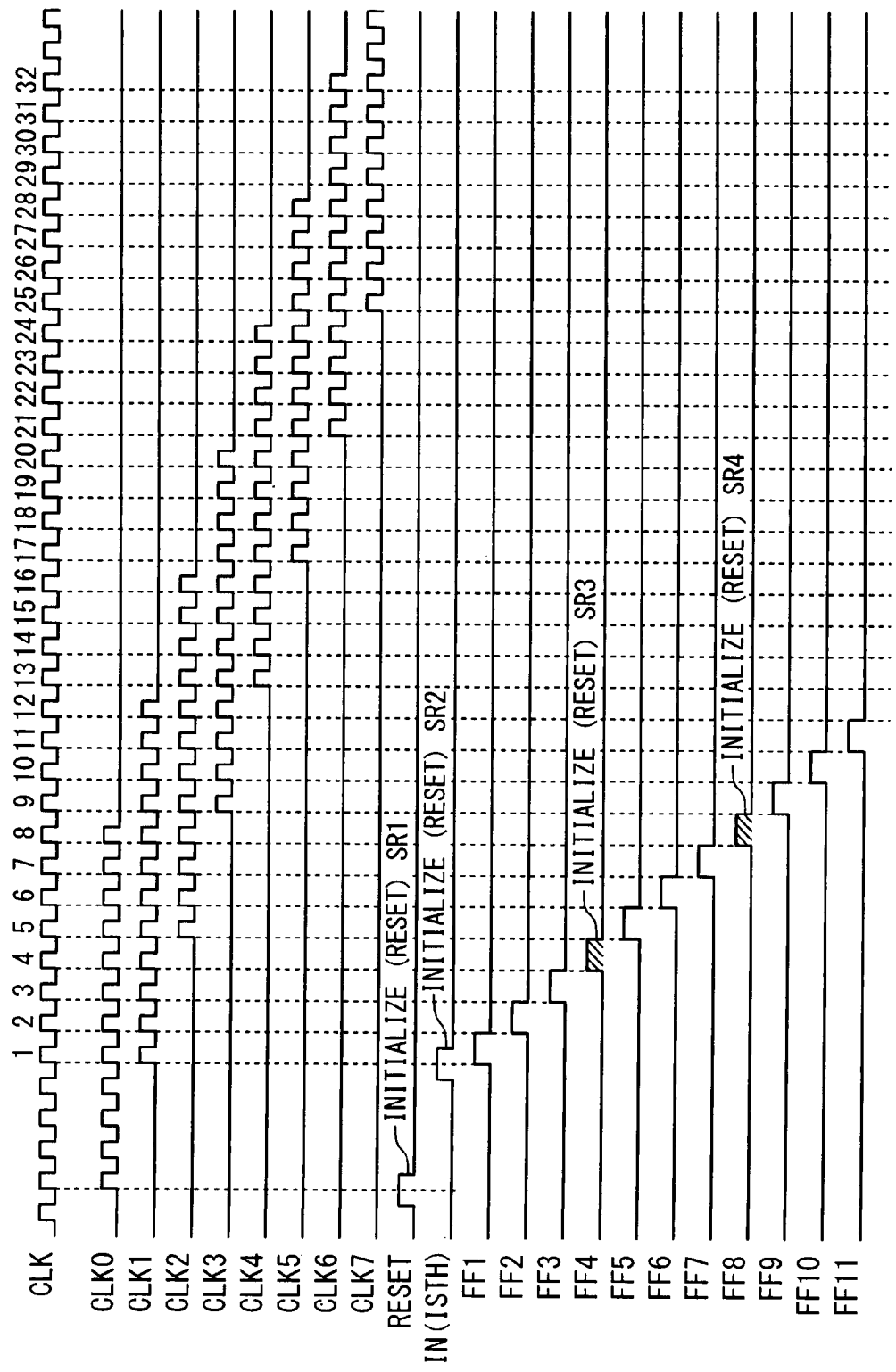

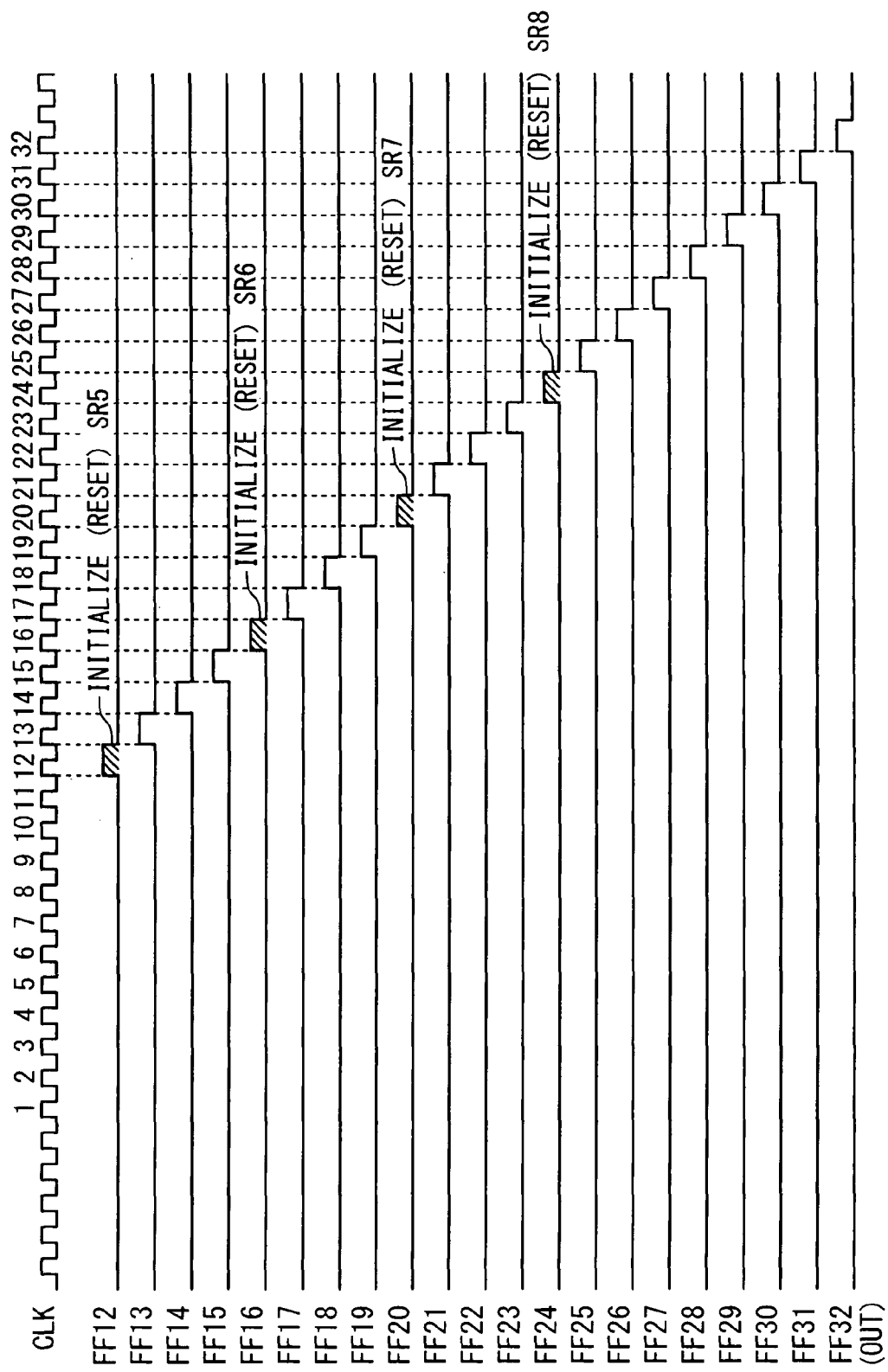

DATA DRIVER AND DISPLAY APPARATUS USING THE SAME INCLUDING CLOCK CONTROL CIRCUIT AND SHIFT REGISTER CIRCUIT

BACKGROUND OF THE INVENTION

1. Field of the Invention

The present invention relates to a data driver and a display apparatus for displaying a display data by using the data driver. The present invention is based on Japanese Patent Application No. 2006-330962. The disclosure of the application is incorporated herein by reference.

2. Description of Related Art

Display apparatuses such as a TFT (Thin Film Transistor) type liquid crystal display apparatus, a simple-matrix type liquid crystal display apparatus, an electroluminescence (EL) display apparatus, and a plasma display apparatus have been widely used.

As an example of a conventional display apparatus, the TFT type liquid crystal display apparatus will be described. FIG. 1 shows a configuration of the conventional TFT type liquid crystal display apparatus 101. The display apparatus 101 includes a timing controller 2, a gate driver 120, a data driver 130 and a liquid crystal panel 10.

The liquid crystal panel 10 includes a plurality of pixels 11 which are arranged on a glass substrate 3 in a matrix. For example, (m×n) pixels 11 (m and n are integers of 2 or more) are arranged on the glass substrate 3. Each of the (m×n) pixels 11 includes a thin film transistor (TFT) 12 and a pixel capacitor 15. The pixel capacitor 15 includes a pixel electrode and a counter electrode opposite to the pixel electrode. The TFT 12 includes a drain electrode 13, a source electrode 14 connected to the pixel electrode, and a gate electrode 16.

The gate driver 120 is connected to one end of m gate lines G1 to Gm. The data driver 130 is connected to one end of n data lines D1 to Dn. The m gate lines G1 to Gm are connected to the gate electrodes 16 of the TFTs 12 of the pixels 11 in m rows, respectively. The n data lines D1 to Dn are connected to the drain electrodes 13 of the TFTs 12 of the pixels 11 in n columns, respectively.

The timing controller 2 supplies a gate clock signal GCLK to the gate driver 120 to select and drive one of the gate lines in one horizontal period. Also, the timing controller 2 supplies a clock signal CLK and one-line display data DATA to the data driver 130. A data DATA for one horizontal line contains n display data corresponding to the data lines D1 to Dn.

The data driver 130 outputs the n display data to the n data lines D1 to Dn in accordance with the clock signal CLK. At this time, the TFTs 12 of (1×n) pixels 11 corresponding to the driven gate line and the n data lines D1 to D2 are turned on. Therefore, the n display data are written to the pixel capacitors 15 of the (1×n) pixels 11, which are held until a next write operation of display data. With this, the n display data are displayed as the one-line display data DATA.

The data driver 130 includes K data driver circuits 130-1 to 130-K which are cascade-connected in this order for allowing display of the n pixels. FIG. 2 shows a configuration of the data driver circuit 130. It should be noted that "K" is an integer of 2 or more, which satisfies n/y (n>y, y is an integer of 2 or more). Each of the K data driver circuits 130-1 to 130-K includes an internal signal circuit 40, a shift register circuit 131, a data register circuit 32, a latch circuit 33, a level shifter circuit 34, a digital/analog (D/A) converter circuit 35, a data output circuit 36, and a gradation voltage generating circuit 37.

The internal signal circuit 40 is connected to the shift register circuit 131. The shift register circuit 131 is connected to the data register circuit 32, and the data register circuit 32 is connected to the latch circuit 33. The latch circuit 33 is connected to the level shifter circuit 34, and the level shifter circuit 34 is connected to the D/A converter circuit 35. The D/A converter circuit 35 is connected to the data output circuit 36 and the gradation voltage generating circuit 37. Y output buffers of the data output circuit 36 are connected to y data lines D1 to Dy, respectively.

The gradation voltage generating circuit 37 includes a plurality of γ-correction resistance elements that are connected in series as shown in FIG. 3. The gradation voltage generating circuit 37 divides a difference between reference voltages from a power supply circuit (not shown) by the plurality of γ-correction resistance elements to generate a plurality of gradation voltages. For example, when a display of sixty-four gradation levels is performed, the gradation voltage generating circuit 37 divides reference voltages by sixty-three γ-correction resistance elements R0 to R62, and generates positive-polarity gradation voltages. The same is performed for negative-polarity gradation voltages.

The shift register circuit 131 includes y registers (not shown), and the data register circuit 32 includes y registers (not shown). The latch circuit 33 includes y latches (not shown), and the level shifter circuit 34 includes y level shifters (not shown).

The D/A converter circuit 35 includes y D/A converters (see FIG. 4). The y D/A converters contain a P-type converters (PchDAC) which output the positive-polarity gradation voltages and N-type converters (NchDAC) which output the negative-polarity gradation voltage. For example, of the above y D/A converters, odd-numbered D/A converters are the PchDAC, and even-numbered D/A converters are the NchDAC. The D/A converter circuit 35 further includes y switching elements (see FIG. 4) for performing an inversion drive in which the positive-polarity gradation voltage and the negative-polarity gradation voltage are alternately applied to the pixels 11. The data output circuit 36 includes y output buffers or amplifiers (see FIG. 4).

The timing controller 2 supplies the clock signal CLK to the K data driver circuits 130-1 to 130-K, supplies the one-line display data DATA to the K data driver circuits 130-1 to 130-K in one horizontal period, and supplies a shift pulse signal STH to the data driver circuit 130-1 as a start pulse signal. The data driver circuit 130-$i$ outputs the y display data contained in the one-line display data DATA to the y data lines D1 to Dy, respectively, in response to the clock signal CLK and the shift pulse signal STH. It should be noted that "i" is an integer that satisfies $1 \leq i \leq K$.

In this case, the internal signal circuit 40 of the data driver circuit 130-1 generates a reset signal RESET and an internal shift pulse signal ISTH that is delayed by a predetermined number of clocks from the reset signal RESET, based on the shift pulse signal STH supplied from the timing controller 2, and outputs those signals to the shift register circuit 131. The y shift registers of the shift register circuit 131 of the data driver circuit 130-$i$ (i=1, 2, . . . , K) are reset in response to the reset signal RESET (will be described later).

In the data driver circuit 130-$i$ (in this case, i=1, 2, . . . , K-1), each of the y shift registers of the shift register circuit 131 shifts the internal shift pulse signal ISTH in order in synchronization with the clock signals CLK, and outputs the shifted signal to the y data registers of the data register circuit 32. The yth shift register of the shift register circuit 131 outputs the internal shift pulse signal ISTH to the yth data register of the data register circuit 32, and outputs it to the data driver circuit 130-($i$+1) (in this case, i=1, 2, ..., K−1). In the data driver circuit 130-K, each of the y shift registers of the shift register circuit 131 shifts the internal shift pulse signal ISTH in order in synchronization with the clock signal CLK, and outputs the shifted signal to the y data registers of the data register circuit 32.

In the data driver circuit 130-$i$, each of the y shift registers acquires the y display data from the timing controller 2 in synchronization with the internal shift pulse signal ISTH from the y shift registers of the shift register circuit 131, and outputs them to the y latches of the latch circuit 33. The y latches latch the y display data from the y data registers of the data register circuit 32 at a same timing, and output them to the y level shifters of the level shifter circuit 34. Each of the y level shifters performs level-conversion on the y display data, and the y level shifters output them to the y D/A converters of the D/A converter circuit 35. The y D/A converters perform a digital/analog conversion on the y display data outputted from the y level shifters of the level shifter circuit 34. For example, as shown in FIG. 4, each of the PchDACs serving as the odd-numbered (the 1st, 3rd, ..., (y−1)th) D/A converters selects an output gradation voltage from among the positive-polarity sixty-four gradation voltages in accordance with the display data outputted from a corresponding one of the odd-numbered (the 1st, 3rd, ..., (y−1)th) level shifters, and outputs the selected voltage to a corresponding one of the odd-numbered (the 1st, 3rd, ..., (y−1)th) output buffers of the data output circuit 36 via a corresponding one of the odd-numbered (the 1st, 3rd, ..., (y−1)th) switching elements. Also, each of the NchDACs serving as the even-numbered (the 2nd, 4th, ..., yth) D/A converters selects an output gradation voltage among the negative-polarity sixty-four gradation voltages in accordance with the display data outputted from a corresponding one of the even-numbered (the 2nd, 4th, ..., yth) level shifters, and outputs the selected voltage to a corresponding one of the even-numbered (the 2nd, 4th, ..., yth) output buffers of the data output circuit 36 via a corresponding one of the even-numbered (the 2nd, 4th, ..., yth) switching elements.

Meanwhile, for performing an inversion drive, as shown in FIG. 4, each of the PchDACs serving as the odd-numbered (the 1st, 3rd, ..., (y−1)th) D/A converters selects an output gradation voltage among the positive-polarity gradation voltages of sixty-four gradations in accordance with the display data outputted from a corresponding one of the odd-numbered (the 1st, 3rd, ..., (y−1)th) level shifters, and outputs the selected voltage to a corresponding one of the even-numbered (the 2nd, 4th, ..., yth) output buffers of the data output circuit 36 via a corresponding one of the odd-numbered (the 1st, 3rd, ..., (y−1)th) switching elements. Also, each of the NchDACs serving as the even-numbered (the 2nd, 4th, ..., yth) D/A converters selects an output gradation voltage among the negative-polarity sixty-four gradation voltages in accordance with the display data outputted from a corresponding one of the even-numbered (the 2nd, 4th, ..., yth) level shifters, and outputs the selected voltage to a corresponding one of the odd-numbered (the 1st, 3rd, ..., (y−1)th) output buffers of the data output circuit 36 via a corresponding one of the even-numbered (the 2nd, 4th, ..., yth) switching elements.

As such, each of the above-described y D/A converters outputs the y output gradation voltages to the y output buffers of the data output circuit 36. The y output buffers output the y display data from the D/A converter circuit 35 to the y data lines D1 to Dy.

FIG. 5 shows a configuration of the shift register circuit 131 of the data driver circuit 130-$i$. The shift register circuit 131 of the data driver circuit 130-$i$ is a 32-bit shift register circuit (y=32), which includes eight 4-bit partial shift registers SR1 to SR8 which are cascade-connected in this order. As shown in FIG. 6, each of the eight partial shift registers SR1 to SR8 includes four synchronous D-type flip-flops (to be referred to as flip-flops, hereinafter) F1 to F4 which are cascade-connected in this order. Each of the four flip-flops F1 to F4 needs to be reset (initialized) then is subjected to a normal operation, since an output state thereof becomes unstable under circumstances, e.g. immediately after a supply of a power source, and immediately after the transfer direction of a bidirectional register is switched. Therefore, each of the four flip-flops F1 to F4 has a reset input (R), in addition to a clock input (C), a data input (D), and an output (Q). Each output (Q) of the four flip-flops F1 to F4 is connected to the above-described data register circuit 32.

The data input (D) of the flip-flop F1 of the partial shift register SR1 of the data driver circuit 130-1 is connected to the internal signal circuit 40 thereof, and the internal shift pulse signal ISTH is supplied thereto. The output (Q) of the flip-flop F4 of the partial shift register SRj of the data driver circuit 130-$i$ is connected to the data input (D) of the flip-flop F1 of the partial shift register SR(j+1) of the data driver circuit 130-$i$. It should be noted that "j" is an integer that satisfies 1≦j≦7. The output (Q) of the flip-flop F4 of the partial shift register SR8 of the data driver circuit 130-$i$ is connected to the data input (D) of the partial shift register SR1 of the data driver circuit 130-($i$+1). Each clock input (C) of the eight partial shift registers SR1 to SR8 of the data driver circuit 130-$i$ is connected to the timing controller 2, and the clock signal CLK is supplied thereto. Each reset input (R) of the eight partial shift registers SR1 to SR8 of the data driver circuit 130-$i$ is connected to the internal signal circuit 40 thereof, and the reset signal RESET is supplied thereto.

Now, among the K data driver circuits 130-1 to 130-K, an operation of the shift register circuit 131 of the data driver circuit 130-1 will be described. The timing controller 2 always outputs the clock signal CLK to each of shift register circuits 131 of the K data driver circuits 130-1 to 130-K.

When resetting (initializing) the shift register circuits 131 of the K data driver circuits 130-1 to 130-K, the internal signal circuit 40 of the data driver circuit 130-1 generates the reset signal RESET and the internal shift pulse signal ISTH that is delayed by a predetermined number of clocks from the reset signal RESET based on the shift pulse signal STH supplied from the timing controller 2, and outputs those signals to the shift register circuit 131.

First, the internal signal circuit 40 of the data driver circuit 130-1 outputs the reset signal RESET to the partial shift registers SR1 to SR8 of the shift register circuit 131. The reset signal RESET is in a high level. At this time, each of the partial shift registers SR1 to SR8 is reset to an initial state in accordance with the reset signal RESET. Then, the internal signal circuit 40 of the data driver circuit 130-1 outputs the internal shift pulse signal ISTH to the flip-flop F1 of the partial shift register SR1 of the shift register circuit 131. The internal shift pulse signal ISTH is in the high level. For example, the partial shift register SRj outputs the internal shift pulse signal ISTH to the data register circuit 32 in synchronization with the clock signal CLK for four times, and outputs the internal shift pulse signal ISTH (when being synchronized with the clock signal CLK for four times) to the flip-flop F1 of the partial shift register SR(j+1). The partial shift register SR8 outputs the internal shift pulse signal ISTH outputted from the partial shift register SR7 to the data register circuit 32 in synchronization with the clock signal CLK for four times, and outputs the internal shift pulse signal ISTH (when being synchronized with the clock signal CLK for four times) to the flip-flop F1 of the partial shift register SR1 of the shift register circuit 131 of the data driver circuit 130-2. However, in the above-described data driver 130 (K data driver circuits 130-1 to 130-K), the eight partial shift registers SR1 to SR8 of the shift register circuit 131 are reset simultaneously, thereby causing following problems.

Recently, display apparatuses have been large-scaled to display the display data in a larger screen, in which the number of outputs of the display apparatus are increased. In accordance with this, the number of elements is also increased in the data driver 130. When the eight partial shift registers SR1 to SR8 as the elements operate simultaneously, an operation current (peak value) at that time increases drastically, so that a supply voltage to be supplied to the TFT type liquid crystal display apparatus 101 becomes fluctuated. This may cause malfunctions or may become a factor for generating electromagnetic noise (EMI) in some cases.

The same is true when the gate drover 120 includes the shift register circuit 131.

In conjunction with the above description, Japanese Laid Open Patent Application (JP-A-Showa 59-14195) discloses a semiconductor apparatus in which the timings of reset are shifted. This semiconductor apparatus includes a plurality of latch circuits and delay circuits. In this publication, the delay circuits delay reset signals so that the plurality of latch circuits are not reset simultaneously.

A case is discussed where the technique disclosed in Japanese Laid Open Patent Application (JP-A-Showa 59-14195) is applied to the above-described shift register circuit 131. For example, it is considered that the above delay circuit includes 8 delay sections, the 8 delay sections are connected to the eight partial shift registers SR1 to SR8, respectively, and the plurality of latch circuits are the eight partial shift registers SR1 to SR8. In this case, a delay time when the 8 delay sections delay the reset signals is referred to as 1st to 8th delay times. The 1st to 8th delay times are longer in this order. The 1st to 8th delay sections delay the reset signals by the 1st to 8th delay time, respectively, and outputs them to the partial shift registers SR1 to SR8. Each of the partial shift registers SR1 to SR8 executes a reset operation based on a corresponding one of the reset signals from the 8 delay sections.

However, in the technique disclosed in Japanese Laid Open Patent Application (JP-A-Showa 59-14195), the reset signal is not synchronized with the clock signal CLK. Thus, when the 8 delay sections output the reset signals without synchronizing with the clock signals CLK, the reset signals are outputted from the 8 delay sections at the improper timings. The partial shift registers SR1 to SR8 perform the reset at the improper timings in response to the reset signals from the 8 delay sections, respectively. Therefore, when the internal shift pulse signal ISTH is supplied to the partial shift register SR1 of the shift register circuit 131, the internal shift pulse signal ISTH is outputted from the partial shift register SR8 at an improper timing. As a result, the data register circuit 32 cannot acquire the n display data from the timing controller 2 in synchronization with the internal shift pulse signal ISTH from the shift register circuit 131.

As described, it is desired that the partial shift registers SR1 to SR8 do not perform reset operations simultaneously, while performing the reset operations in synchronization with the clock signal CLK.

SUMMARY OF THE INVENTION

In a first embodiment of the present invention, a data driver circuit includes a shift register section including flip-flops in cascade-connection and configured to shift a pulse signal through the flip-flops in synchronization with a clock signal, and a control circuit configured to receive a display data in response to the shifted pulse signal from the shift register section and to drive data lines of a display section based on display data to display the display data on the display section. The flip-flops are grouped in units of N (N is an integer of 2 or more) flip-flops into M (M is an integer of 2 or more) partial shift registers, and the shift register circuit is reset in units of partial shift registers.

In a second embodiment of the present invention, a display apparatus includes a display panel having gate lines, data lines, and pixels arranged at intersections of the gate lines and the data lines; a gate driver configured to drive the gate lines sequentially; and a data driver configured to drive the data lines based on display data in each of horizontal periods. The data driver includes K (K is an integer of 2 or more) data driver circuits which are cascade-connected. Each of the data driver circuits includes a shift register section including flip-flops in cascade-connection and configured to shift a pulse signal through the flip-flops in synchronization with a clock signal, and a control circuit configured to receive a corresponding portion of the display data in response to the shifted pulse signal from the shift register circuit and to drive corresponding ones of the data lines based on the corresponding portion of the display data. The flip-flops are grouped in units of N (N is an integer of 2 or more) flip-flops into M (M is an integer of 2 or more) partial shift registers, and the shift register circuit is reset in units of partial shift registers.

In a third embodiment of the present invention, a shift register circuit includes a clock control section configured to generate a shift clock signal in synchronization to a clock signal; and a shift register comprising flip-flops in cascade-connection and configured to shift a pulse signal in synchronization with the shift clock signal. The flip-flops are grouped in units of N (N is an integer of 2 or more) flip-flops into M (M is an integer of 2 or more) partial shift registers, and the shift register is reset in units of partial shift registers.

BRIEF DESCRIPTION OF THE DRAWINGS

The above and other objects, advantages and features of the present invention will be more apparent from the following description of certain embodiments taken in conjunction with the accompanying drawings, in which:

FIGS. 11A and 11B are a timing chart showing an operation of the shift register circuit and a clock control circuit of the data driver circuit in the embodiment.

DESCRIPTION OF THE PREFERRED EMBODIMENTS

Hereinafter, a display apparatus to which a data driver of the present invention is applied will be described in detail with reference to the attached drawings. The present invention is applied to a TFT (Thin Film Transistor) type liquid crystal display apparatus, a simple-matrix type liquid crystal display apparatus, an electroluminescence (EL) display apparatus, a plasma display apparatus, and the like.

Figure 1:
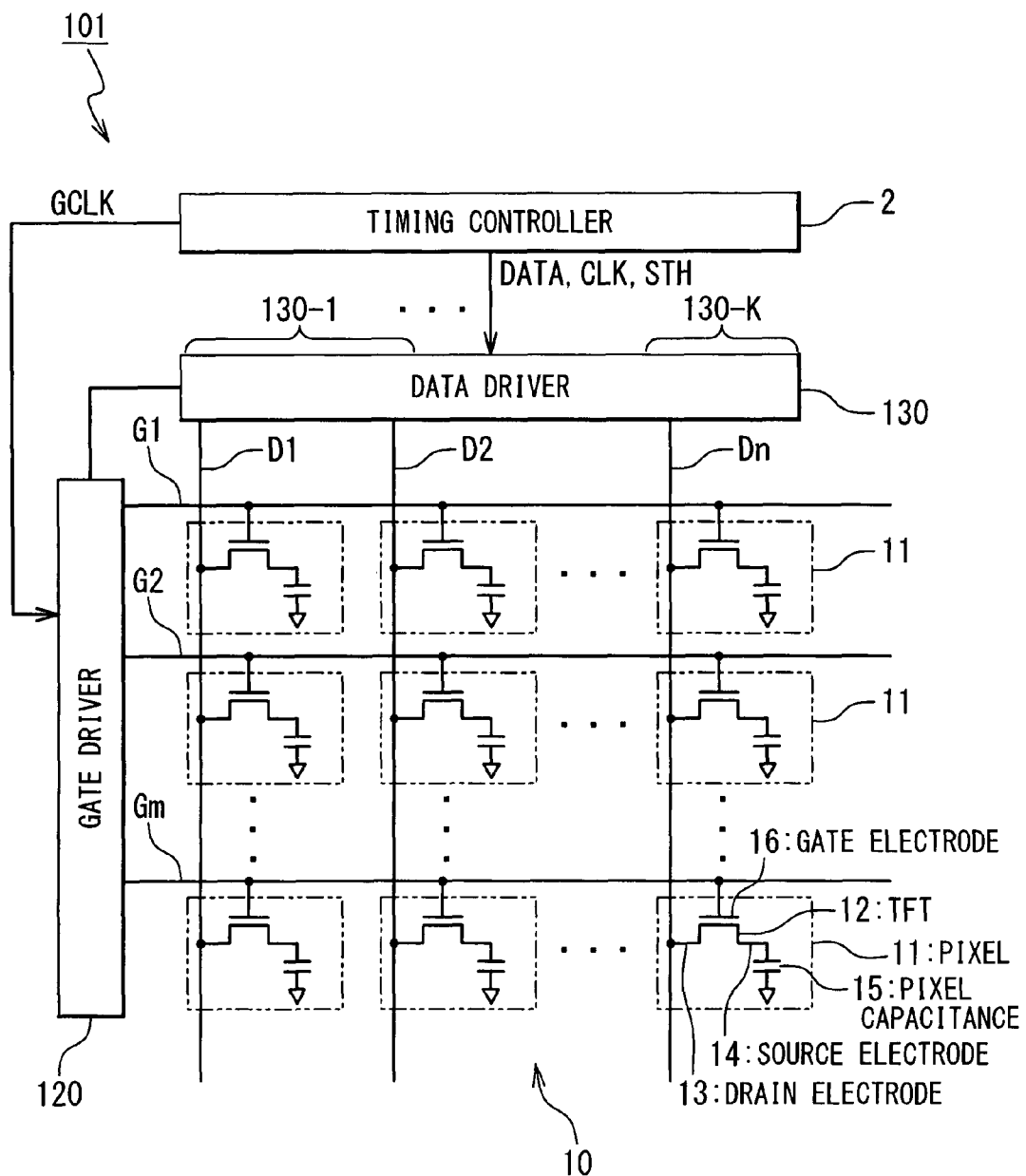
FIG. 1 is a block diagram showing a configuration of a conventional TFT type liquid crystal display apparatus.
Figure 7:
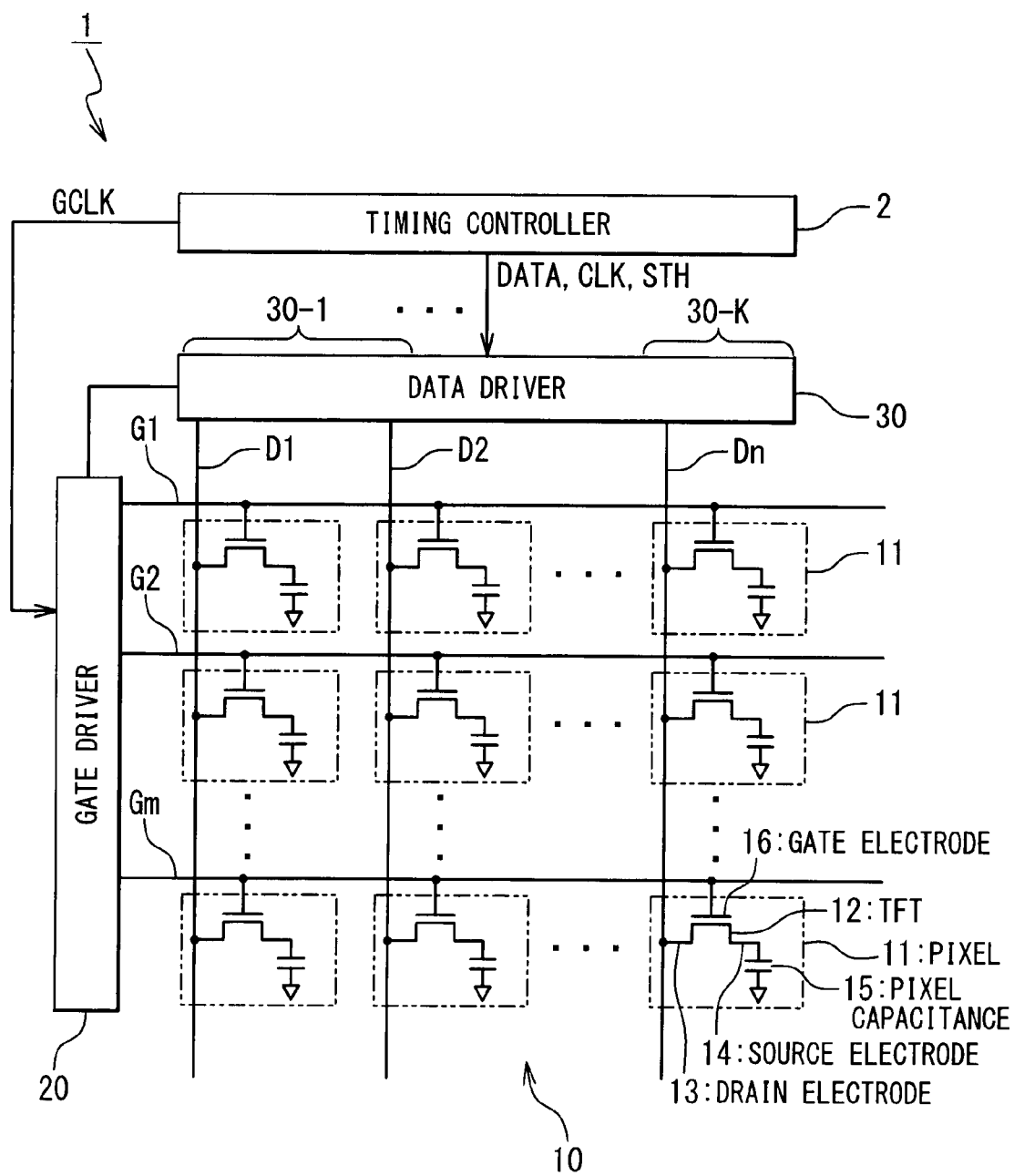
FIG. 7 is a block diagram showing a configuration of a display apparatus of the present invention.

FIG. 7 is a block diagram showing a configuration of a TFT type liquid crystal display apparatus 1 as the display apparatus of the present invention. It should be noted that the same reference numerals are assigned to the same or similar components in FIG. 1, and their description will be omitted.

The TFT type liquid crystal display apparatus 1 includes a timing controller 2, a gate driver 20 and a data driver 30, a display section (liquid crystal panel) 10. The gate driver 20 is connected to one end of the m gate lines G1-Gm. The data driver 30 is connected to one end of the n data lines D1 to Dn. The timing controller 2 supplies a gate clock signal GCLK to the gate driver 20 to select one of the gate lines in one horizontal period. The timing controller 2 supplies a clock signal CLK and data DATA for one horizontal line to the data driver 30. The data DATA contains n display data for the data lines D1 to Dn.

Figure 8:
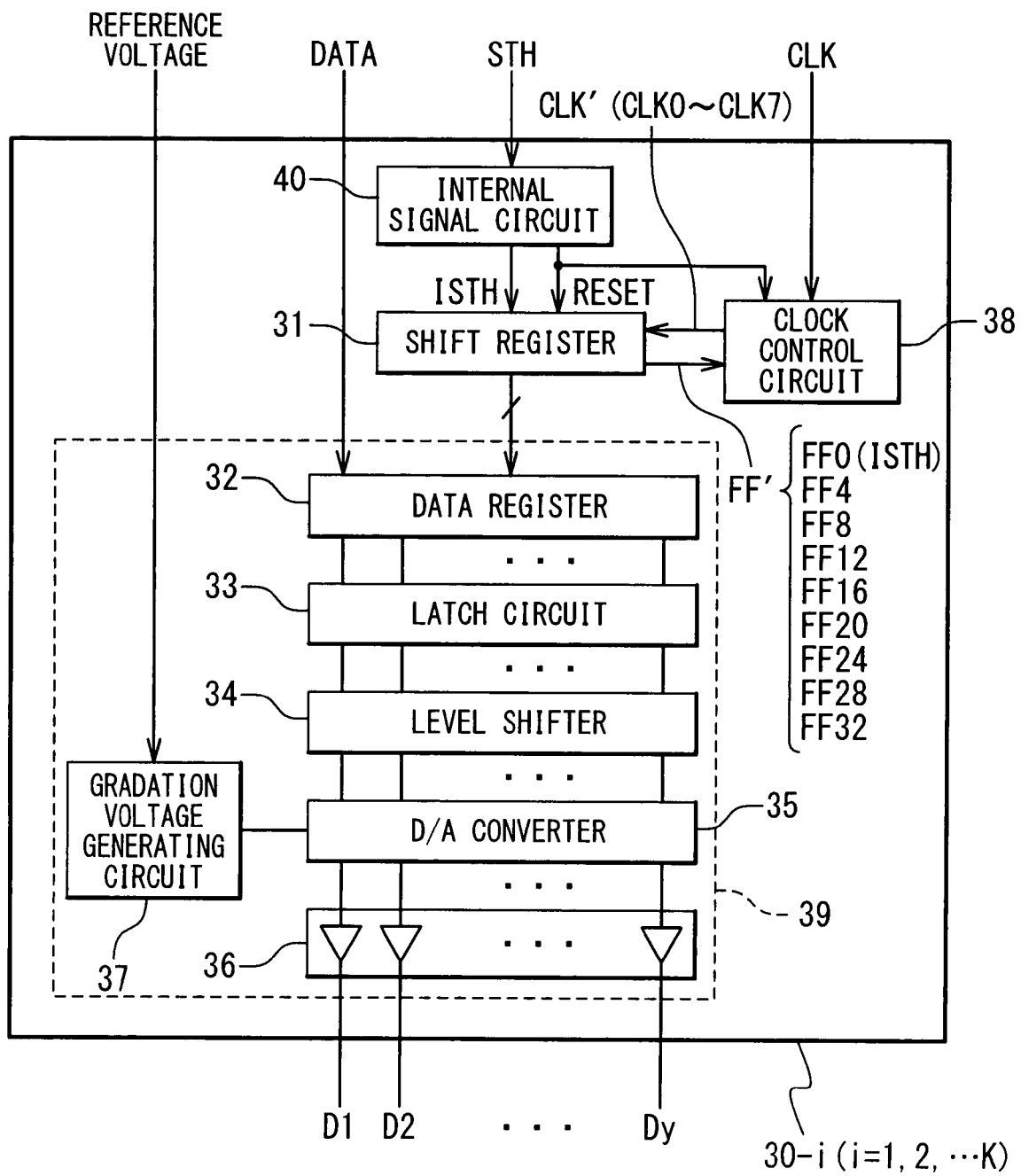
FIG. 8 is a block diagram showing a configuration of each of data driver circuits according to an embodiment of the present invention.

FIG. 8 is a block diagram showing a configuration of the data driver 30. The data driver 30 includes K data driver circuits 30-1 to 30-K which are cascade-connected in this order to make a display of the n pixels possible. It should be noted that "K" is an integer of 2 or more, which satisfies n/y (n>y, y is an integer of 2 or more). Each of the K data driver circuits 30-1 to 30-K of the data driver 30 includes an internal signal circuit 40, a shift register circuit 31, a clock control circuit 38, and a control section 39. The control section 39 includes a data register circuit 32, a latch circuit 33, a level shifter circuit 34, a digital/analog (D/A) converter circuit 35, a data output circuit 36, and a gradation voltage generating circuit 37.

The internal signal circuit 40 is connected to the shift register 31 and the clock control circuit 38. The shift register 31 is connected to the data register circuit 32 and the clock control circuit 38, and includes y shift registers (not shown). The timing controller 2 supplies the clock signal CLK to the K data driver circuits 30-1 to 30-K, supplies the data DATA for one horizontal line to the K data driver circuits 30-1 to 30-K in one horizontal period, and supplies a shift pulse signal STH to the data driver circuit 30-1 as a start pulse signal. The data driver circuit 30-i outputs the y data contained in the one-line display data DATA to y data lines D1 to Dy, respectively, in response to the clock signal CLK and the shift pulse signal STH. It should be noted that "i" is an integer that satisfies $1 \leq i \leq K$. In this case, the internal signal circuit 40-1 of the data driver circuit 30-1 generates a reset signal RESET and an internal shift pulse signal ISTH that has been delayed by a predetermined number of clocks from the reset signal RESET based on the shift pulse signal STH supplied from the timing controller 2, and outputs those signals to the shift register 31. In response to the reset signal RESET, the y shift registers of the shift register circuit 31 of the data driver circuit 30-i (i=1, 2, . . . , K) are reset, as described later.

Figure 2:
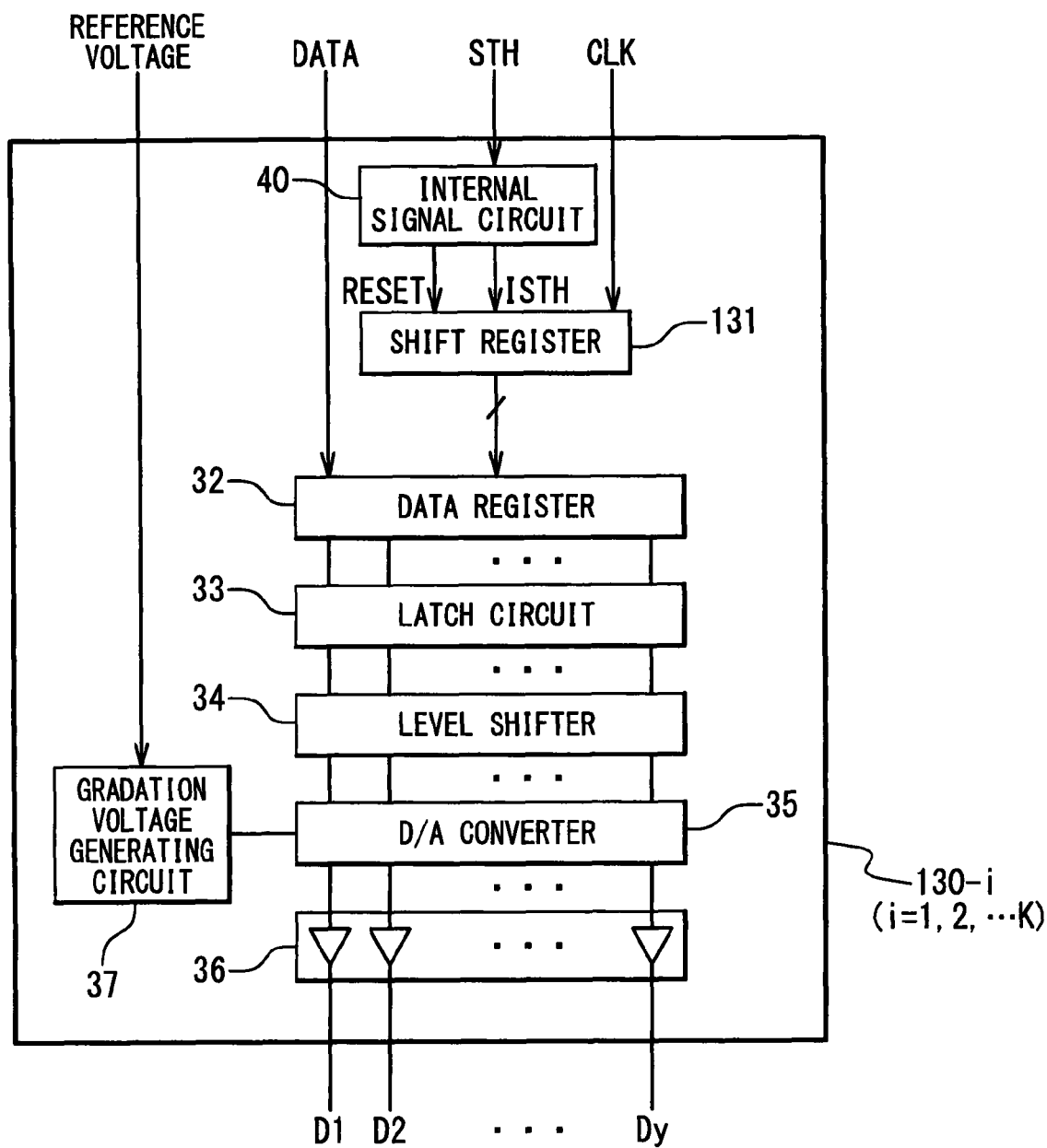
FIG. 2 is a block diagram showing a configuration of each of data driver circuits used in a conventional data driver in the conventional TFT type liquid crystal display apparatus.
Figure 3:
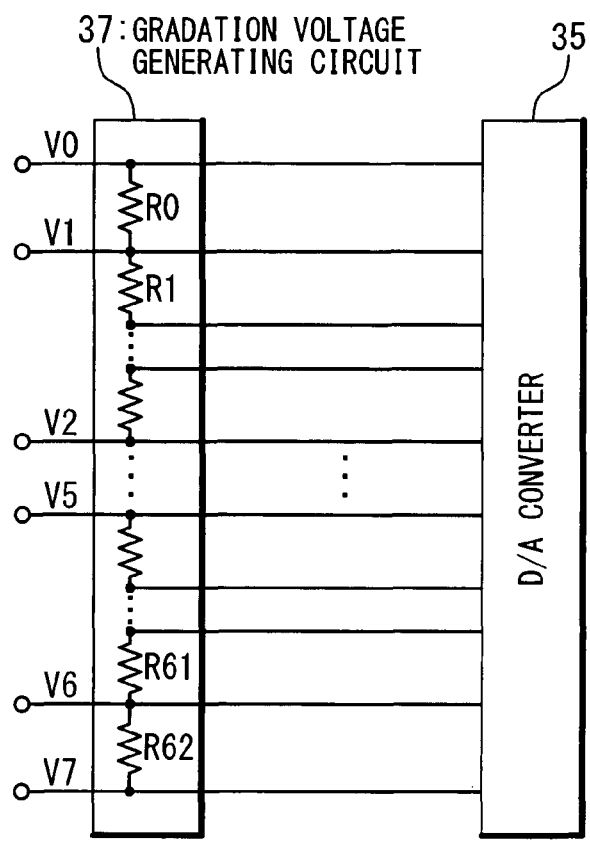
FIG. 3 is a block diagram showing a configuration of a gradation voltage generating circuit in the conventional TFT type liquid crystal display apparatus.
Figure 4:
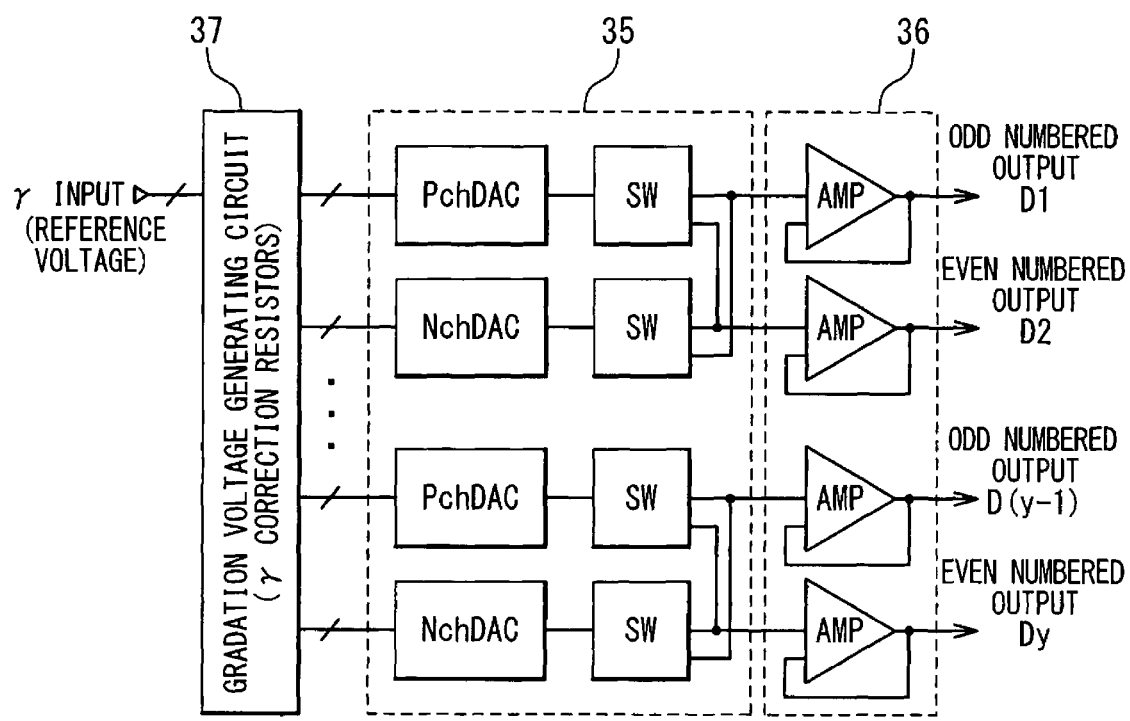
FIG. 4 is a block diagram showing a configuration of a D/A converter circuit and a data output circuit in the conventional TFT type liquid crystal display apparatus.
Figure 5:
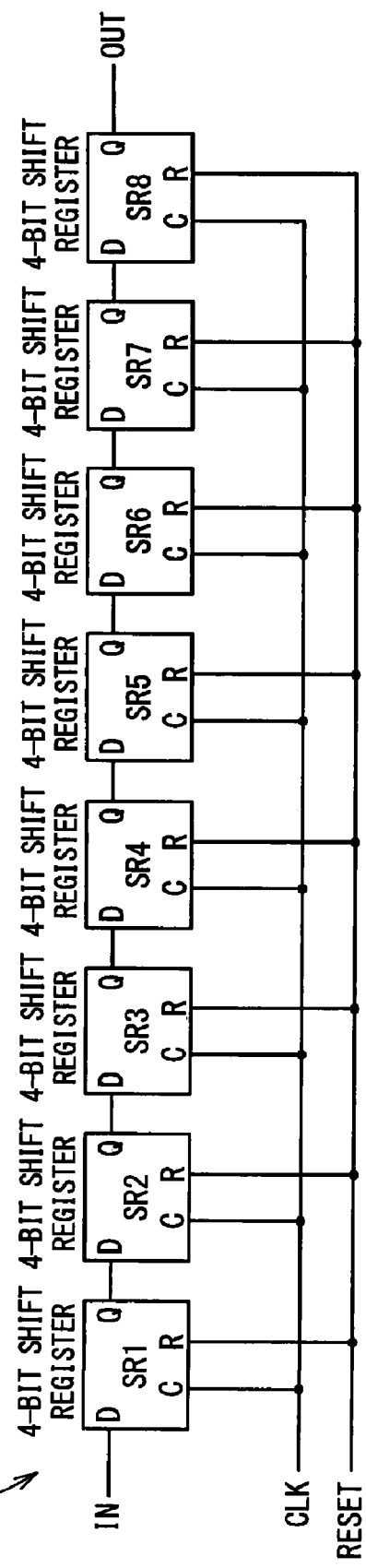
FIG. 5 is a circuit diagram showing a configuration of a shift register circuit in the conventional TFT type liquid crystal display apparatus.
Figure 6:
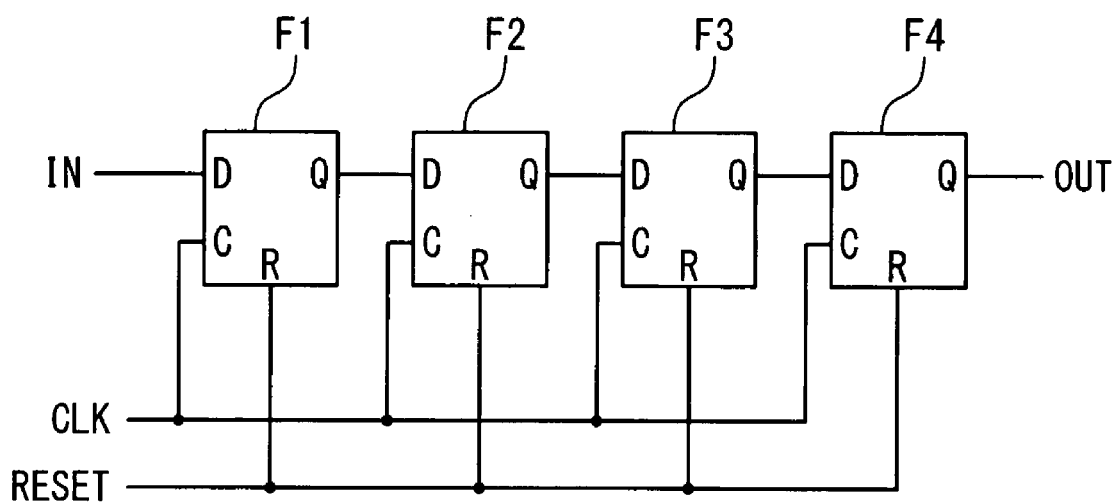
FIG. 6 is a circuit diagram showing a configuration of each of eight partial shift registers in the conventional TFT type liquid crystal display apparatus.

In the data driver circuit 30-i (in this case, i=1, 2, . . . , K−1), the clock control circuit 38 outputs a transfer clock signal CLK' to be described later to the shift register circuit 31 in synchronization with the clock signal CLK. Each of the y shift registers of the shift register circuit 31 shifts the internal shift pulse signal ISTH in order in synchronization with the transfer clock signal CLK' from the clock control circuit 38, and outputs the shifted signal to the y data registers of the data register circuit 32. The shift registers of the shift register circuit 31 output the internal shift pulse signal ISTH to the control section 39, and output (cascade-outputs) it to the data driver circuit 30-(i+1) (in this case, i=1, 2, . . . , K−1). In the data driver circuit 30-K, each of the y shift registers of the shift register circuit 31 shifts the internal shift pulse signal ISTH in order in synchronization with the transfer clock signal CLK', and outputs the shifted signal to a corresponding one of the y data registers of the data register circuit 32. An operation of the control section 39 (the data register circuit 32, the latch circuit 33, the level shifter circuit 34, the D/A converter circuit 35, the data output circuit 36, and the gradation voltage generating circuit 37) are the same as that of the TFT type liquid crystal display apparatus 101 shown in FIG. 2.

Figure 9:
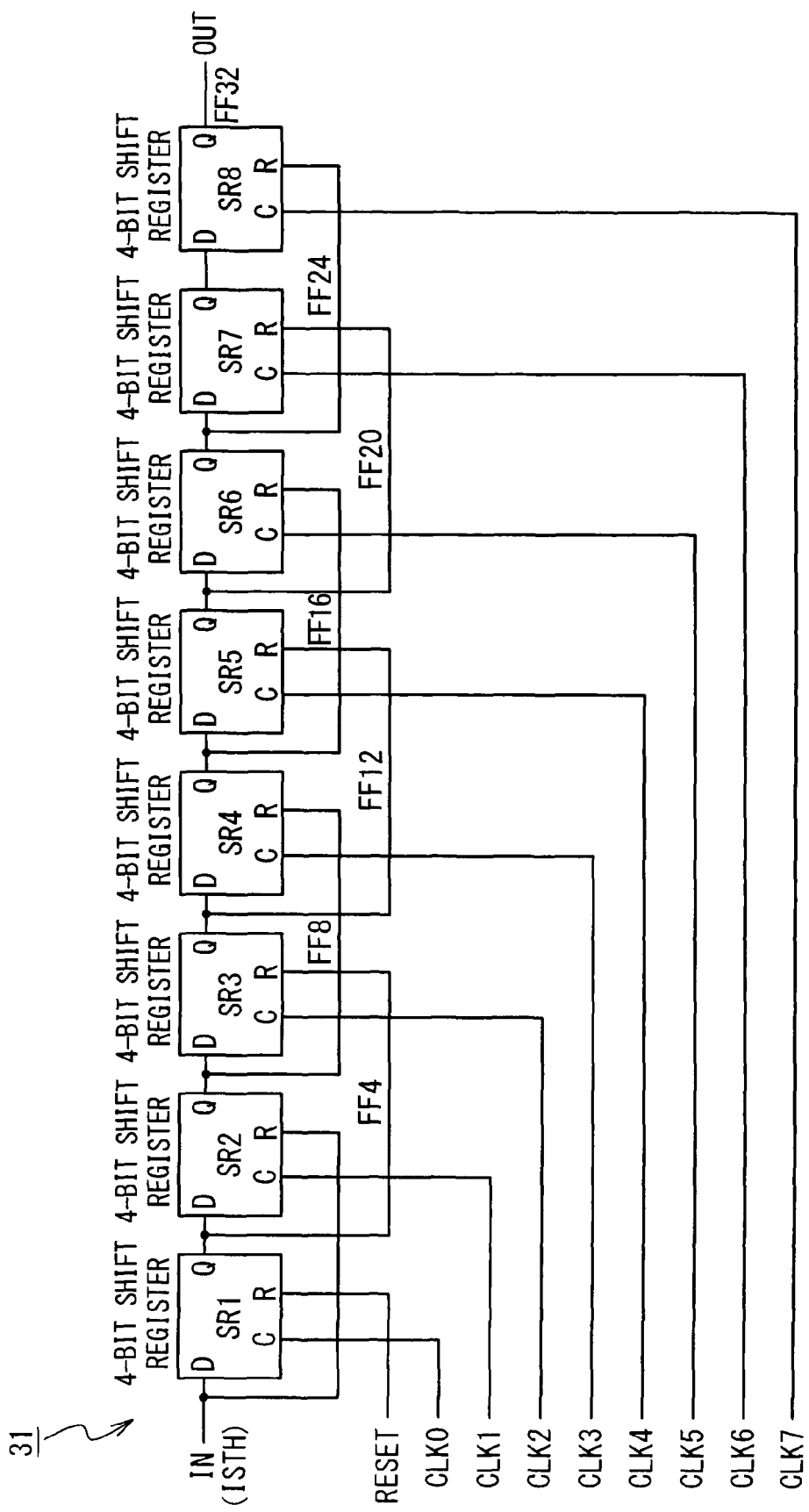
FIG. 9 is a circuit diagram showing a hardware configuration of a shift register circuit of the data driver circuit in the embodiment.

FIG. 9 shows a hardware configuration of the shift register circuit 31 of the data driver circuit 30-i. The shift register circuit 31 of the data drier circuit 30-i is a (M×N)-bit shift register, which includes M partial shift registers SR1 to SRM which are cascade-connected in this order ("M" is an integer of 2 or more, and "N" is an integer of 1 or more (for example, M=8 (M=$2^3$), and N=4 (N=$2^2$))). The M partial shift registers SR1 to SRM are N-bit shift registers.

Figure 10:
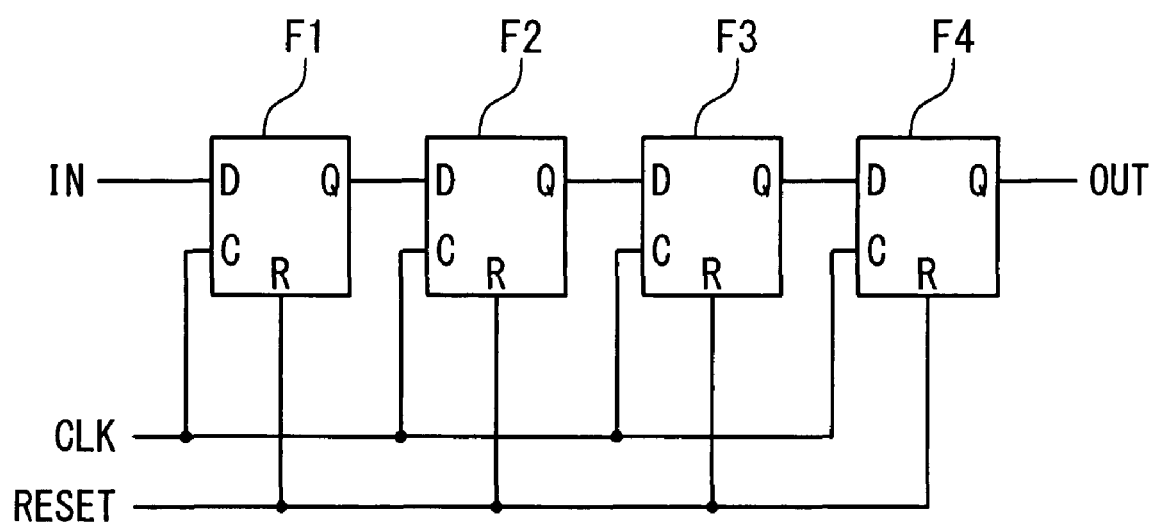
FIG. 10 is a circuit diagram showing a configuration of each of eight partial shift registers in the exemplary embodiment.

As shown in FIG. 10, each of the M partial shift registers SR1 to SRM includes N synchronous D-type flip-flops (to be referred to as flip-flops simply, hereinafter) F1 to FN which are cascade-connected in this order. Each of the N flip-flops F1 to FN has a clock input (C), a data input (D), an output (Q), and a reset input (R). The outputs (Q) of the N flip-flops F1 to FN are connected to the above-described data register circuit 32. The data input (D) of the flip-flop F1 of the partial shift register SR1 of the data driver circuit 30-1 is connected to the internal signal circuit 40, and the internal shift pulse signal ISTH is supplied thereto. The output (Q) of the flip-flop FN of the partial shift register SRj of the data driver circuit 30-i is connected to the data input (D) of the flip-flop F1 of the partial shift register SR(j+1) of the data driver circuit 30-i. It should be noted that "j" is an integer that satisfies $1 \leq j \leq (M-1)$. The output (Q) of the flip-flop FN of the partial shift register SRM of the data driver circuit 30-i is connected to the data input (D) of the partial shift register SR1 of the data driver circuit 30-(i+1). The clock inputs (C) of the M partial shift registers SR1 to SRM of the data driver circuit 30 are connected to the clock control circuit 38, and the 1st to Mth transfer clock signals are respectively supplied thereto, as the transfer clock signal CLK'.

The reset input (R) of the partial shift register SR1 of the data driver circuit 30-i is connected to the internal signal circuit 40 thereof, and the reset signal RESET is supplied thereto. The reset input (R) of the partial shift register SR(j+1) of the data driver circuit 30-i is connected to the data input (D) of the flip-flop F1 of the partial shift register SRj of the data driver circuit 30-i, and the internal shift pulse signal ISTH is supplied thereto as the reset signal RESET.

The timing controller 2 always outputs the clock signal CLK to each of the clock control circuits 38 of the K data driver circuits 30-1 to 30-K.

When resetting (initializing) the shift register circuits 31 of the K data driver circuits 30-1 to 30-K, the internal signal circuit 40 of the data driver circuit 30-1 generates the reset signal RESET and the internal shift pulse signal ISTH that has been delayed by a predetermined number of clocks from the reset signal RESET based on the shift pulse signal STH supplied from the timing controller 2, and outputs those signals to the shift register circuit 31-1.

First, the internal signal circuit 40 of the data driver circuit 30-1 outputs the reset signal RESET to the partial shift register SR1 and the clock control circuit 38 of the shift register circuit 31-1. The reset signal RESET is in a high level. At this time, the clock control circuit 38 of the data driver circuit 30-1 receives the reset signal RESET as a first transfer control signal FF' from the internal signal circuit 40, and outputs the reset signal RESET to the partial shift register SR1 in synchronization with the clock signal CLK in accordance with the first transfer control signal FF'. The partial shift register SR1 of the shift register circuit 31 in the data driver circuit 30-1 is reset to an initial state in accordance with the reset signal RESET from the internal signal circuit 40.

Next, the internal signal circuit 40 of the data driver circuit 30-1 outputs the internal shift pulse signal ISTH to the flip-flop F1 of the partial shift register SR1 of the shift register circuit 31-1, and outputs the internal shift pulse signal ISTH to the partial shift register SR2 of the shift register circuit 31-1 as the reset signal RESET. The internal shift pulse signal ISTH is in the high level.

The partial shift register SRj receives the internal shift pulse signal ISTH. At this time, the partial shift register SR(j+1) is reset to an initial state while resetting a held signal, in accordance with the internal shift pulse signal ISTH supplied to the partial shift register SRj. The partial shift register SRj outputs the internal shift pulse signal ISTH to the data register circuit 32 in synchronization with the clock signal CLK for N times, and outputs the internal shift pulse signal ISTH (when being synchronized with the clock signal CLK for N times) to the flip-flop F1 of the partial shift register SR(j+1) and the clock control circuit 38.

The clock control circuit 38 receives the internal shift pulse signal ISTH supplied to the partial shift register SRj as a (j+1)th transfer control signal FF', and outputs the (j+1)th transfer clock signal to the partial shift register SR(j+1) in synchronization with the clock signal CLK in accordance with the (j+1)th transfer control signal FF'. The clock control circuit 38 stops the output of the jth transfer clock signal when the internal shift pulse signal ISTH is received from the partial shift register SR(j+1). The partial shift register SRM of the data driver circuit 30-1 receives the internal shift pulse signal ISTH from the partial shift register SR(M−1), and outputs it to the data register circuit 32 in synchronization with the Mth transfer clock signal for N times. At the same time, the partial shift register SRM outputs the internal shift pulse signal ISTH (when being synchronized with the clock signal CLK N times) to the flip-flop F1 of the partial shift register SR1 of the shift register circuit 31 of the data driver circuit 30-2 and the clock control circuit 38 of the data driver circuit 30-1.

Although being not shown, the clock control circuit 38 receives a signal, which has been delayed from an output of the partial shift register SRM by N clocks of the clock signal CLK, as the transfer control signal FF', and stops the output of the Mth transfer clock signal in accordance with the transfer control signal FF'.

Recently, a display apparatus has become large-scaled in order to display the display data on a larger screen, in which the number of outputs of the display apparatus is increased. In accordance with this, the number of elements is also increased in the data driver 30 of the TFT type liquid crystal display apparatus 1 according to the present invention. When the M partial shift registers SR1 to SRM as the elements operate simultaneously, an operation current (peak value) at that time increases drastically, so that a supply voltage supplied to the TFT type liquid crystal display apparatus 1 becomes fluctuated. This may cause malfunctions or may become a factor for generating electromagnetic noise (EMI) in some cases. The same is true when the gate driver 20 also includes the shift register circuit 31.

However, in the data driver 30 (K data driver circuits 30-1 to 30-K) of the TFT type liquid crystal display apparatus 1 according to the present invention, the partial shift register SR(j+1) of the shift register circuit 31 is reset in response to the internal shift pulse signal ISTH supplied to the partial shift register SRj ($1 \leq j \leq (M-1)$). This internal shift pulse signal ISTH is transferred as the reset signal RESET to the partial shift registers SR1 to SRM successively in synchronization with the clock signals CLK (first to Mth transfer clock signals). In this way, each of the partial shift registers SR1 to SRM is reset successively in synchronization with the clock signals CLK. Therefore, the partial shift registers SR1 to SRM of the shift register circuit 31 do not perform the reset operations simultaneously, and the reset operation can be performed in synchronization with the clock signal CLK (internal shift pulse signal ISTH).

In the data driver 30 (K data driver circuits 30-1 to 30-K) of the TFT type liquid crystal display apparatus 1 according to the present invention, the reset signal RESET is synchronized with the clock signal CLK. Thus, the partial shift registers SR1 to SRM are reset at the proper timings in accordance with the signals RESET from the internal signal circuit 40 and the partial shift registers SR1 to SR(M−2), respectively. Therefore, when the internal shift pulse signal ISTH is supplied to the partial shift register SR1 of the shift register circuit 31, the internal shift pulse signal ISTH is outputted from the partial shift register SRM at the proper timing. As a result, the data register circuit 32 can acquire the n display data from the timing controller 2 in synchronization with the internal shift pulse signal ISTH from the shift register circuit 31.

Further, in the data driver 30 (K data driver circuits 30-1 to 30-K) of the TFT type liquid crystal display apparatus 1 according to the present invention, the clock control circuit 38 controls the start and stop of the outputs of the 1st to Mth transfer clock signals. Therefore, the shift register circuit 31 can output the internal shift pulse signal ISTH to the data register circuit 32 at a more adequate timing.

Among the K data driver circuits 30-1 to 30-K, an operation of the shift register circuit 31 and the clock circuit 38 of the data driver circuit 30-1 will be described in detail. FIG. 11A and FIG. 11B are timing charts showing the operation of the shift register circuit 31. In this case, it is assumed here that "M" is 8, and "N" is 4.

Here, as shown in FIGS. 11A and 11B, the four flip-flops F1 to F4 in each of the partial shift registers SR1 to SR8 are referred to as the flip-flops FF1 to FF32 by using sequential numbers. Further, as shown in FIGS. 11A and 11B, the first to eighth transfer clock signals are referred to as transfer clock signals CLK0 to CLK7, respectively, as the transfer clock signals CLK'.

First, in one horizontal period, the shift pulse signal STH is supplied from the timing controller 2 to the internal signal circuit 40 of the data driver circuit 30-1. At this time, the reset signal RESET is supplied from the internal signal circuit 40 to the partial shift register SR1 of the shift register circuit 31 and the clock control circuit 38. The reset signal RESET is in the high level. The clock control circuit 38 receives the reset signal RESET from the internal signal circuit 40 as the first transfer control signal FF', and outputs the transfer clock signal CLK0 as the first transfer clock signal to the partial shift register SR1 in synchronization with the clock signal CLK in accordance with the first transfer control signal FF'. The partial shift register SR1 is reset in accordance with the reset signal RESET from the internal signal circuit 40.

Then, the internal shift pulse signal ISTH is supplied from the internal signal circuit 40 to the flip-flop FF1 of the partial shift register SR1 of the shift register circuit 31, and the internal shift pulse signal ISTH is supplied to the partial shift register SR2 as the reset signal RESET. This internal shift pulse signal ISTH is in the high level. The partial shift register SR1 receives the internal shift pulse signal ISTH from the internal signal circuit 40. At this time, the partial shift register SR2 is resets in accordance with the internal shift pulse signal ISTH supplied to the partial shift register SR1. The partial shift register SR1 outputs the internal shift pulse signal ISTH from the internal signal circuit 40 to the data register circuit 32 in synchronization with the transfer clock signal CLK0 for four times, and outputs the internal shift pulse signal ISTH (when being synchronized with the transfer clock signal CLK0 for four times) to the flip-flop FF5 of the partial shift register SR2 and the clock control circuit 38.

The clock control circuit 38 receives the internal shift pulse signal ISTH supplied to the partial shift register SR1 as a second transfer control signal FF', and outputs the transfer clock signal CLK1 as the second transfer clock signal to the partial shift register SR2 in synchronization with the clock signal CLK in accordance with the second transfer control signal FF'. The partial shift register SR2 receives the internal shift pulse signal ISTH from the flip-flop FF4. At this time, the partial shift register SR3 is reset in accordance with the internal shift pulse signal ISTH supplied to the partial shift register SR2. The partial shift register SR2 outputs the internal shift pulse signal ISTH from the flip-flop FF4 to the data register circuit 32-1 in synchronization with the transfer clock signal CLK1 for four times, and outputs the internal shift pulse signal ISTH (when being synchronized with the transfer clock signal CLK1 for four times) to the flip-flop FF9 of the partial shift register SR3 and the clock control circuit 38. The clock control circuit 38 receives the internal shift pulse signal ISTH from the flip-flop FF4 of the partial shift register SR1 as a third transfer control signal FF'. The clock control circuit 38 outputs the transfer clock signal CLK2 as the third transfer clock signal to the partial shift register SR3 in synchronization with the clock signal CLK in accordance with the third transfer control signal FF'. The partial shift register SR3 receives the internal shift pulse signal ISTH from the flip-flop FF8. At this time, the partial shift register SR4 is reset in accordance with the internal shift pulse signal ISTH supplied to the partial shift register SR3.

The partial shift register SR3 shifts and outputs the internal shift pulse signal ISTH from the flip-flop FF8 to the data register circuit 32 in synchronization with the transfer clock signal CLK2 for four times, and outputs the internal shift pulse signal ISTH (when being synchronized with the transfer clock signal CLK2 for four times) to the flip-flop FF13 of the partial shift register SR4 and the clock control circuit 38. The clock control circuit 38 receives the internal shift pulse signal ISTH from the flip-flop FF8 of the partial shift register SR2 as a fourth transfer control signal FF'. The clock control circuit 38 stops the output of the transfer clock signal CLK0 and outputs the transfer clock signal CLK3 as the fourth transfer clock signal to the partial shift register SR4 in synchronization with the clock signal CLK in accordance with the fourth transfer control signal FF'.

In the data driver circuit 30-1, the same operation is repeated to the partial shift registers SR4 and the subsequent. That is, the partial shift registers SR4 to SR8 of the data driver circuit 30-1 receive the internal shift pulse signals ISTH from the flip-flops FF12, FF16, FF20, FF24, and FF28, respectively. At this time, each of the partial shift registers SR5 to SR8 is reset in accordance with the internal shift pulse signal ISTH supplied to a corresponding one of the partial shift registers SR4 to SR7. The partial shift registers SR4 to SR8 output the internal shift pulse signals ISTH from the flip-flops FF12, FF16, FF20, FF24, FF28 to the data register circuit 32 in synchronization with the transfer clock signals CLK3 to CLK7 for four times, respectively. Further, the partial shift registers SR4 to SR7 output the internal shift pulse signals ISTH (when being synchronized with the transfer clock signal CLK3 to CLK6 for four times) to the flip-flops FF17, FF21, FF25, FF29 of the partial shift registers SR5 to SR8 and the clock control circuit 38, respectively.

The clock control circuit 38 receives the internal shift pulse signals ISTH from the flip-flops FF12, FF16, FF20, FF24, FF28, and FF36 of the partial shift registers SR3 to SR8 as fifth to tenth transfer control signals FF'. The clock control circuit 38 stops the outputs of the transfer clock signals CLK1 to CLK6 in accordance with the fifth to tenth transfer control signals FF'. Further, the clock control circuit 38 outputs the transfer clock signals CLK4 to CLK7 as the fifth to eighth transfer clock signals to the partial shift registers SR5 to SR8 in synchronization with the clock signal CLK in accordance with the fifth to eighth transfer control signals FF'. Although not shown, the clock control circuit 38 receives a signal, which has been delayed from an output of the partial shift register SR8 by four clocks of the clock signal CLK, for example, as the transfer control signal FF', and stops the output of the transfer clock signal CLK7 in accordance with the transfer control signal FF'.

As described above, in the data driver 30 (K data driver circuits 30-1 to 30-K) of the TFT type liquid crystal display apparatus 1 according to the present invention, the partial shift register SR(j+1) of the shift register circuit 31 is reset in accordance with the internal shift pulse signal ISTH supplied to the partial shift register SRj ($1 \leq j \leq 7$). This internal shift pulse signal ISTH is shifted and transferred as the reset signal RESET to the partial shift registers SR1 to SR8 successively in synchronization with the clock signals CLK (transfer clock signals CLK0 to CLK7). In this way, each of the partial shift registers SR1 to SR8 is reset successively in synchronization with the clock signals CLK. Therefore, the partial shift registers SR1 to SR8 of the shift register circuit 31 do not perform the reset operations simultaneously, and the reset can be performed in synchronization with the clock signals CLK (internal shift pulse signals ISTH).

In the data driver 30 (K data driver circuits 30-1 to 30-K) of the TFT type liquid crystal display apparatus 1 according to the present invention, the reset signal RESET is synchronized with the clock signal CLK. Thus, the partial shift registers SR1 to SR8 are reset at the proper timings in accordance with the reset signals RESET from the internal signal circuit 40, and the partial shift registers SR1 to SR6, respectively. Therefore, when the internal shift pulse signal ISTH is supplied to the partial shift register SR1 of the shift register circuit 31, the internal shift pulse signal ISTH is outputted from the partial shift register SR8 at the proper timing. As a result, the data register circuit 32 can acquire the n display data from the timing controller 2 in synchronization with the internal shift pulse signal ISTH from the shift register circuit 31.

Further, in the data driver 30 (K data driver circuits 30-1 to 30-K) of the TFT type liquid crystal display apparatus 1 according to the present invention, the clock control circuit 38 controls the start and stop of the outputs of the transfer clock signals CLK0 to CLK7. Therefore, the shift register circuit 31 can output the internal shift pulse signal ISTH to the data register circuit 32 at a more proper timing.

What is claimed is:

1. A data driver circuit comprising:
a shift register section comprising flip-flops in cascade-connection and configured to shift a pulse signal through said flip-flops in synchronization with a clock signal, the shift register section including said flip-flops grouped in units of N (N is an integer of at least 2) flip-flops into M (M is an integer of 2 ) partial shift registers, and said M partial shift registers are reset in units of partial shift registers in synchronization with the clock signal, the M partial shift registers are connected in cascade; and
a control circuit configured to receive a display data in response to the shifted pulse signal from said shift register section and to drive data lines of a display section based on display data to display the display data on the display section,
wherein a first one of said M partial shift registers is reset in response to a reset signal, and
each of said M partial shift registers other than said first partial shift register is reset in response to supply of the pulse signal or the shifted pulse signal input to one of said M partial shift registers which is directly previous to said partial shift register.

2. The data driver circuit according to claim 1, wherein said shift register section comprises:
a clock control circuit configured to generate a shift clock signal in synchronization to the clock signal; and
a shift register circuit comprising said flip-flops and configured to shift the pulse signal through said flip-flops in synchronization with the shift clock signal, and
said clock control circuit outputs said shift clock signal to said M partial shift registers such that each of said M partial shift registers operates during a first period in a horizontal period and rests during a remaining period in the horizontal period.

3. The data driver circuit according to claim 2, wherein said clock control circuit outputs said shift clock signal which contains partial shift clock signals respectively corresponding to said M partial shift registers, and
each of said M partial shift registers shifts the pulse signal or the shifted pulse signal in synchronization with the corresponding to partial shift clock signal.

4. The data driver circuit according to claim 3, wherein said clock control circuit starts the output of each of said partial shift clock signals when the pulse signal or the shifted pulse signal is supplied to one of said M partial shift registers which is previous to said partial shift register corresponding to said partial shift clock signal.

5. The data driver circuit according to claim 3, wherein said clock control circuit stops the output of each of said partial shift clock signals when the pulse signal or the shifted pulse signal is outputted from one of said M partial shift registers which is next to said partial shift register corresponding to said partial shift clock signal.

6. The data driver according to claim 1, wherein a reset operation is performed in synchronization with the clock signal to prohibit simultaneous reset of the partial shift registers.

7. A display apparatus comprising:
a display panel having gate lines, data lines, and pixels arranged at intersections of said gate lines and said data lines;
a gate driver configured to drive said gate lines sequentially; and
a data driver configured to drive said data lines based on display data in each of horizontal periods,
wherein said data driver comprises K (K is an integer of at least 2) data driver circuits which are cascade-connected, and
each of said data driver circuits comprises:
a shift register section comprising flip-flops in cascade-connection and configured to shift a pulse signal through said flip-flops in synchronization with a clock signal,
the shift register section including said flip-flops grouped in units of N (N is an integer of at least 2) flip-flops into M (M is an integer of at least 2) partial shift registers, and said M partial shift registers are reset in units of partial shift registers in synchronization with the clock signal, the M partial shift registers are connected in cascade; and
a control circuit configured to receive a corresponding portion of the display data in response to the shifted pulse signal from said shift register section and to drive corresponding ones of said data lines based on the corresponding portion of the display data,
wherein a first one of said M partial shift registers is reset in response to a reset signal, and
each of said M partial shift registers other than said first partial shift register is reset in response to supply of the pulse signal or the shifted pulse signal input to one of said said M partial shift registers which is directly previous to said partial shift register.

8. The display apparatus according to claim 7, wherein said shift register section comprises:
a clock control circuit configured to generate a shift clock signal in synchronization to the clock signal; and
a shift register circuit comprising said flip-flops and configured to shift the pulse signal through said flip-flops in synchronization with the shift clock signal, and said clock control circuit outputs said shift clock signal to said M partial shift registers such that each of said M partial shift registers operates during a first period in a horizontal period and rests during a remaining period in the horizontal period.

9. The display apparatus according to claim 8, wherein said clock control circuit outputs said shift clock signal which contains partial shift clock signals respectively corresponding to said M partial shift registers, and
each of said M partial shift registers shifts the pulse signal or the shifted pulse signal in synchronization with the corresponding to partial shift clock signal.

10. The display apparatus according to claim 9, wherein said clock control circuit starts the output of each of said partial shift clock signals when the pulse signal or the shifted pulse signal is supplied to one of said M partial shift registers which is previous to said partial shift register corresponding to said partial shift clock signal.

11. The display apparatus according to claim 9, wherein said clock control circuit stops the output of each of said partial shift clock signals when the pulse signal or the shifted pulse signal is outputted from one of said M partial shift registers which is next to said partial shift register corresponding to said partial shift clock signal.

12. The display apparatus according to claim 7, wherein the shifted pulse signal which is outputted from one of said M partial shift registers is supplied as the pulse signal to a first partial shift register of a next data driver circuit.

13. The display apparatus according to claim 7, wherein a reset operation is performed in synchronization with the clock signal to prohibit simultaneous reset of the partial shift registers.

14. A shift register circuit comprising:
a clock control section configured to generate a shift clock signal in synchronization to a clock signal; and
a shift register comprising flip-flops in cascade-connection and configured to shift a pulse signal in synchronization with the shift clock signal,
the shift register section including said flip-flops are grouped in units of N (N is an integer of at least 2) flip-flops into M (M is an integer of at least 2) partial shift registers, and said shift register is reset in units of partial shift registers in synchronization with the clock signal, the M partial shift registers are connected in cascade,
wherein a first one of said M partial shift registers is reset in response to a reset signal, and
each of said M partial shift registers other than said first partial shift register is reset in response to supply of the pulse signal or the shifted pulse signal input to one of said M partial shift registers which is directly previous to said partial shift register.

15. The shift register circuit according to claim 14, wherein said clock control circuit outputs said shift clock signal to said M partial shift registers such that each of said M partial shift registers operates during a specific period in a predetermined period and rests during a remaining period in the predetermined period.

16. The shift register circuit according to claim 15, wherein said clock control circuit outputs said shift clock signal which contains partial shift clock signals respectively corresponding to said M partial shift registers, and
each of said M partial shift registers shifts the pulse signal or the shifted pulse signal in synchronization with the corresponding to partial shift clock signal.

17. The shift register circuit according to claim 16, wherein said clock control circuit starts the output of each of said partial shift clock signals when the pulse signal or the shifted pulse signal is supplied to one of said M partial shift registers which is previous to said partial shift register corresponding to said partial shift clock signal.

18. The shift register circuit according to claim 16, wherein said clock control circuit stops the output of each of said partial shift clock signals when the pulse signal or the shifted pulse signal is outputted from one of said M partial shift registers which is next to said partial shift register corresponding to said partial shift clock signal.

19. The shift register circuit according to claim 14, wherein a reset operation is performed in synchronization with the clock signal to prohibit simultaneous reset of the partial shift registers.

* * * * *